United States Patent
Kao et al.

(10) Patent No.: US 8,256,096 B2
(45) Date of Patent: Sep. 4, 2012

(54) METHOD OF USING XENON ION BEAMS TO IMPROVE TRACK WIDTH DEFINITION

(75) Inventors: Stuart Kao, Fremont, CA (US); Chunping Luo, Milpitas, CA (US); Chaopeng Chen, Fremont, CA (US); Takahiko Machita, Tokyo (JP); Daisuke Miyauchi, Tokyo (JP); Jeiwei Chang, Cupertino, CA (US)

(73) Assignees: Headway Technologies, Inc., Milpitas, CA (US); TDK Corporation, Tokyo (JP)

(*) Notice: Subject to any disclaimer, the term of this patent is extended or adjusted under 35 U.S.C. 154(b) by 217 days.

(21) Appl. No.: 11/975,265

(22) Filed: Oct. 18, 2007

(65) Prior Publication Data
US 2008/0040915 A1 Feb. 21, 2008

Related U.S. Application Data

(62) Division of application No. 10/827,950, filed on Apr. 20, 2004, now Pat. No. 7,320,170.

(51) Int. Cl.
*G11B 5/127* (2006.01)
*C23F 1/04* (2006.01)

(52) U.S. Cl. ........... 29/603.18; 29/603.16; 29/603.15; 29/603.12; 216/22; 216/41; 216/66

(58) Field of Classification Search ........... 29/603.12, 29/603.13, 603.14, 603.15, 603.16, 603.18; 216/22, 41, 66; 250/307, 309; 365/158
See application file for complete search history.

(56) References Cited

U.S. PATENT DOCUMENTS

| | | | |
|---|---|---|---|
| 4,874,947 A * | 10/1989 | Ward et al. | 250/307 X |
| 4,992,901 A * | 2/1991 | Keel et al. | 216/66 X |
| 6,002,553 A | 12/1999 | Stearns et al. | |
| 6,058,123 A | 5/2000 | Haase et al. | |
| 6,421,212 B1 | 7/2002 | Gibbons et al. | |
| 6,430,806 B1 * | 8/2002 | Chen et al. | 29/603.14 X |
| 6,434,814 B1 * | 8/2002 | Chang et al. | 29/603.14 |
| 6,554,974 B2 | 4/2003 | Shiratori | |
| 6,829,161 B2 * | 12/2004 | Huai et al. | 365/158 |

FOREIGN PATENT DOCUMENTS

JP  07090631 A * 4/1995

* cited by examiner

*Primary Examiner* — A. Dexter Tugbang
(74) *Attorney, Agent, or Firm* — Saile Ackerman LLC; Stephen B. Ackerman

(57) ABSTRACT

Using a beam of xenon ions together with a suitable mask, a stack is ion milled until a part of it, no more than about 0.1 microns thick, has been removed so that a pedestal having sidewalls, including a vertical section and a shortened taper portion, has been formed. This is followed by formation of conductive lead layers as needed. Using xenon as the sputtering gas enables the point at which milling is terminated to be more precisely controlled.

5 Claims, 3 Drawing Sheets

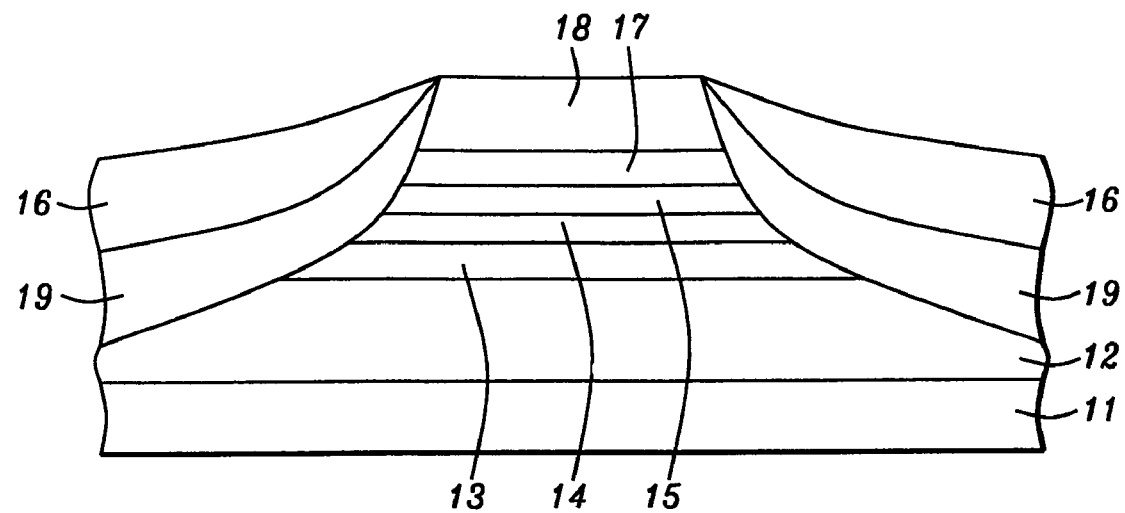
FIG. 1 - Prior Art
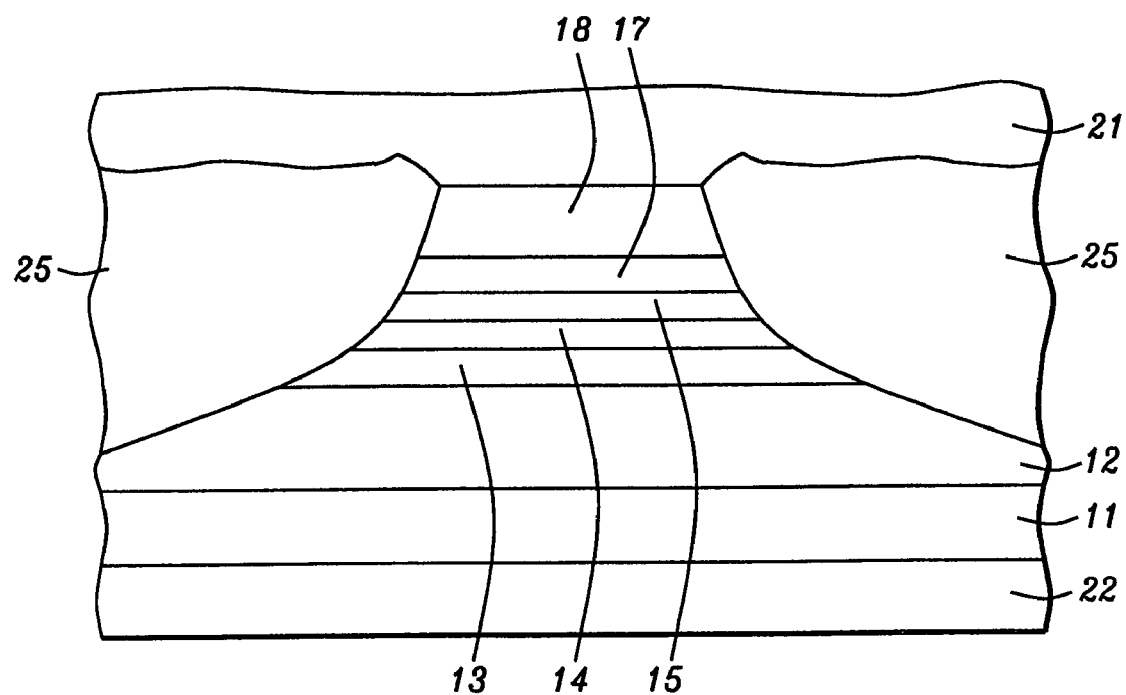
FIG. 2 - Prior Art

METHOD OF USING XENON ION BEAMS TO IMPROVE TRACK WIDTH DEFINITION

This is a divisional application of U.S. patent application Ser. No. 10/827,950, filed on Apr. 20, 2004, which has since matured into U.S. Pat. No. 7,320,170, and which is herein incorporated by reference in its entirety, and assigned to a common assignee.

FIELD OF THE INVENTION

The invention relates to the general field of magnetic read heads with particular reference to formation of the main pedestal through ion milling.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are a seed layer (not shown) on which is an antiferromagnetic layer 11 whose purpose is to act as a pinning agent for magnetically pinned layer 12. Next is a copper spacer layer 13 on which is low coercivity (free) ferromagnetic layer 14. When free layer 14 is exposed to an external magnetic field, the direction of its magnetization is free to rotate according to the direction of the external field. After the external field is removed, the magnetization of the free layer will be at a direction, which is dictated by the minimum energy state, determined by the crystalline and shape anisotropy, current field, coupling field and demagnetization field.

If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase.

Also, as seen in FIG. 1, the GMR stack may be given increased stability by the provision of a second pinning/pinned pair (18 and 17 respectively) that are separated from free layer 14 by decoupling layer 15. The action of the latter is similar to that of spacer 13 except that layer 15 affects the bias while layer 13 affects the GMR ratio.

The example seen in FIG. 1 is a GMR device that measures the resistance of the free layer for current flowing parallel to its two surfaces (CIP). A standard feature of such devices are permanent magnets 19 that but up against the free layer in order to provide longitudinal magnetic bias (and hence stability) at the ends of the free layer. As can be seen, because of the taper in the stack profile, the thickness of the bias layer is somewhat greater at the bottom of the free layer than at its top, so the bias layer partly overlies the-free layer, thereby limiting its effectiveness to some extent.

As the quest for ever greater densities has progressed, devices that measure current flowing perpendicular to the plane (CPP) have begun to emerge. An example of such a device is shown in FIG. 2. The main differences from the CIP device are the top and bottom conductor layers 21 and 22 which ensure that the sensing current of the device passes in a direction normal to the free and spacer layers.

A related device to the CPP GMR described above is the magnetic tunneling junction (MTJ) in which the layer that separates the free and pinned layers is a non-magnetic insulator, such as alumina or silica. Its thickness needs to be such that it will transmit a significant tunneling current. An MTJ is readily visualized by substituting a dielectric layer for spacer layer 16 in FIG. 2. The principle governing the operation of the MTJ in magnetic read sensors is the change of resistivity of the tunnel junction between two ferromagnetic layers when it is subjected to a bit field from magnetic media. When the magnetizations of the pinned and free layers are in opposite directions, the tunneling resistance increases due to a reduction in the tunneling probability. The change of resistance is typically 40%, which is much larger than for GMR devices.

A routine search of the prior art was performed with the following references of interest being found:

Haase et al. note that Xe ion beam etching is known (U.S. Pat. No. 6,058,123). In U.S. Pat. No. 6,554,974, Shiratori confirms that any of several heavy ions, including Xe ions, may be used for sputter etching but does not disclose any particular advantage of xenon over the others. The invention utilizes the known fact that sputter rate increases with angle of incidence to preferentially remove material from the sloping sides of write tracks within a recording surface. U.S. Pat. No. 6,002,553 (Stearns et al.) and U.S. Pat. No. 6,421,212 (Gibbons et al) teach ion beam etching to form CPP GMR sensors.

SUMMARY OF THE INVENTION

It has been an object of at least one embodiment of the present invention to provide a method for forming a multilayer pedestal whose sidewalls contain a section that is vertical.

Another object of at least one embodiment of the present invention has been to provide a CIP read head in which the longitudinal bias leads abut the free layer but do not overlap it.

Still another object of at least one embodiment of the present invention has been to provide a CPP read head in which the free layer has truly vertical sidewalls.

A further object of at least one embodiment of the present invention has been to provide a MTJ read head in which the free layer has truly vertical sidewalls.

A still further object of at least one embodiment of the present invention has been to provide processes for the manufacture of these three read heads.

These objects have been achieved by using xenon ions to perform the ion milling step needed to form the main pedestal. Using xenon enables the vertical section of the pedestal to be made longer, relative to the sloping portion, without requiring an increase in the sputtering rate. This allows the point at which milling is terminated to be controlled more precisely and, thus, also improves design tolerances. In this way it can be ensured that the free layer always has truly vertical sidewalls so the bias magnets cannot overlap it (CIP case) and (for all head types) the read width becomes more precisely defined. These benefits that arise from the use of xenon outweigh its significantly greater cost relative to both argon and krypton.

BRIEF DESCRIPTION OF THE DRAWINGS

FIGS. 1 and 2 respectively show CIP and CPP read heads of the prior art in which the sidewalls at the free layer exhibit considerable slope.

DESCRIPTION OF THE PREFERRED EMBODIMENTS

Figure 3:
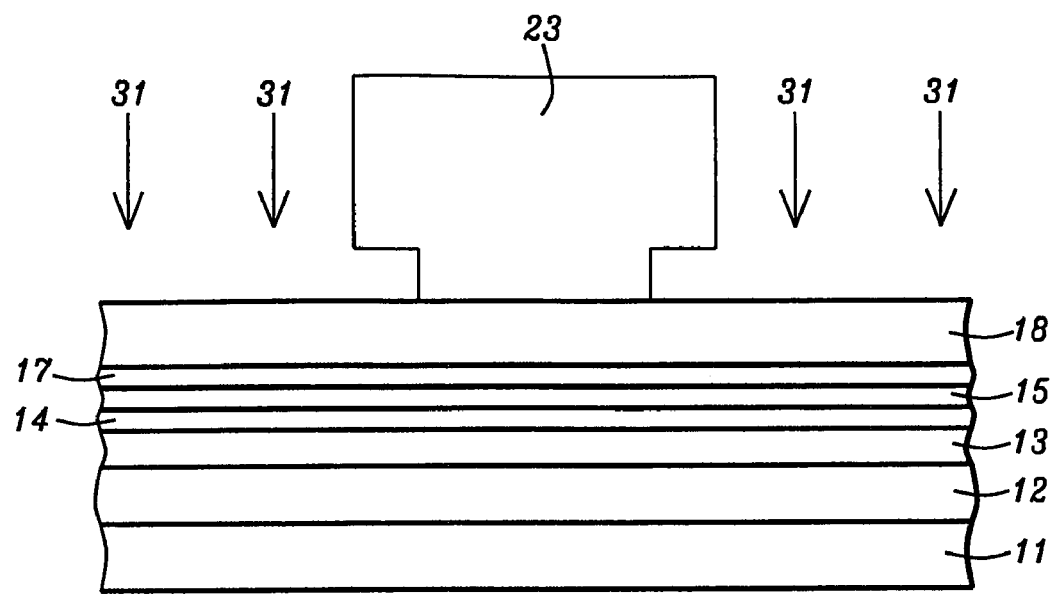
FIG. 3 illustrates use of a mask for the formation of the read head using IBE.

During the fabrication of CPP magnetic recording heads, an ion beam etch (IBE) is normally used, as illustrated in FIG. 3. A critical aspect of this sub-process is the CPP track width definition. It is critical because the precision of the etch stop point and the sidewall profile directly define device geometry (and hence impact device performance). Typically, the IBE process consists of the following steps:

1. Bottom conductor 21 and the GMR stack are deposited prior to the CPP track width definition process.
2. Mask 23 is formed to define the nominal CPP track width, as shown in FIG. 3. This mask can be a single or multi-layered photoresist, the latter being selected if a liftoff process is to be used. Hard masking materials such as Ta, $SiO_2$ etc. could also be used for the mask.
3. Ion beam 31 is used to remove GMR materials from areas not protected by the mask, as shown in FIG. 2. Ar gas is typically used to generate the plasma and the ion beam in an IBE system. The etch stop point is based on the device performance requirements and is limited to certain interfaces or to within certain layers. This step, which requires precise control, is usually assisted by an end point detection device (such as a secondary ion mass spectroscopy, SIMS).
4. Following the IBE process, dielectric material is deposited to electrically insulate the top and bottom conductor outside of the CPP sensor area and also to form the magnetic read gap. The insulating layer can be $Al_2O_3$, $SiO_2$ or other dielectric
5. After the removal of the masking layer, the CPP track width definition process is complete and top conductor 22 is formed.

As we saw in FIGS. 1 and 2, the sidewalls of the CPP pillar produced by the standard IBE process typically has a varying slope, starting out as vertical or near-vertical and then becoming increasingly less so. The height (thickness) of the vertical portion depends on the total etched thickness so Increasing the total etched thickness of the CPP pillar will also increase the height of the vertical portion. The width of each of the layers within the vertical portion is defined by the IBE mask dimension. Hence, within the vertical portion, the tolerance of any individual layer's width across a wafer, $_w$ is the same as that of the mask dimension across the wafer, $_{mask}$, i.e.

$$w = {}_{mask} \quad (1)$$

The slope and the height (thickness) of the tapered portion is determined by the etch rate and thickness of each individual layer within the sloped area. Any material change and/or thickness change can result in the change in slope in the tapered portion. However, for the tapered portion, the width is affected by many factors including layer thickness variation, total etched depth (function of end point and etch rate uniformity) and mask dimension. Within the tapered portion, the tolerance of any individual layer's width across a wafer is represented by the following equation:

$$w = ({}^2_{thk} + {}^2_e + {}^2_{mask} + {}^2_{IBE}) \quad (2)$$

where $_{thk}$ is the total thickness tolerance of film deposition across the wafer, $_{IBE}$ is the tolerance of IBE etch rate uniformity across the wafer, $_e$ is the tolerance of end point sensitivity across the wafer and $_{mask}$ is the tolerance of mask dimension across the wafer.

In a CPP head, the width of the free layer defines the magnetic width. From equations (1) and (2), it is clear that maintaining the free layer within the vertical portion of the CPP pillar is to be preferred since otherwise the width of the free layer has not been precisely defined.

This has been achieved in the present invention by using Xe as the etch gas in the IBE process instead of Ar or krypton, despite the significantly higher cost of xenon relative to the other two. Under the same process conditions, such as beam energy, angle of incidence, and the final etch stop, Xe gas has been found to produce a more vertical sidewall profile than Ar or Kr.

In particular, although an improved the sidewall profile can also be obtained with argon, to do so requires higher beam energy which in turn leads to an increased etch depth because a higher beam energy results in a higher etch rate. Thus, the precision with which the sputtering end point can be controlled is reduced. So the final etch stop point may not be at the optimal design point. By using Xe as the etch gas we can give more latitude to both the design and the process.

The beam energy of Xe can range from about 70 to 1,200 V. The effectiveness of Xe in producing a more vertical sidewall than Ar or other noble gases such as krypton can be achieved with or without target (wafer) rotation or swing motion (substrate oscillates between certain angles). Depending on the process setup, the angle of incidence (from wafer normal) can range from 0 degree to 45 degree.

In order to more fully disclose the present invention, we describe below its application to the manufacture of a CPP GMR read head. This description is readily modified to describe processes for the manufacture of CIP and MTJ devices. Additionally, the process description will serve to clarify the structure of the present invention.

Figure 4:
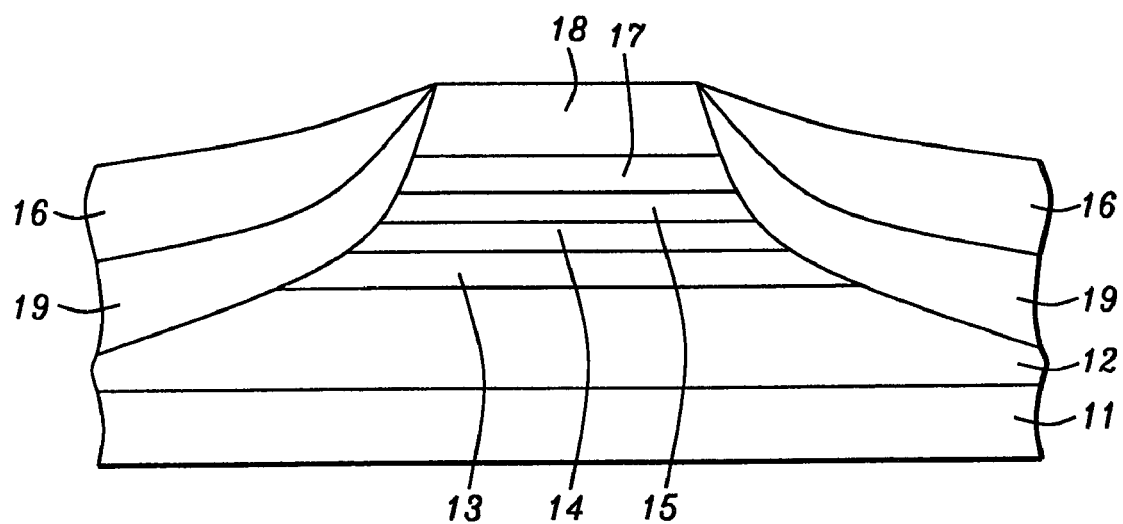
FIG. 4 shows a CIP read head formed according to the teachings of the present invention.
Figure 5:
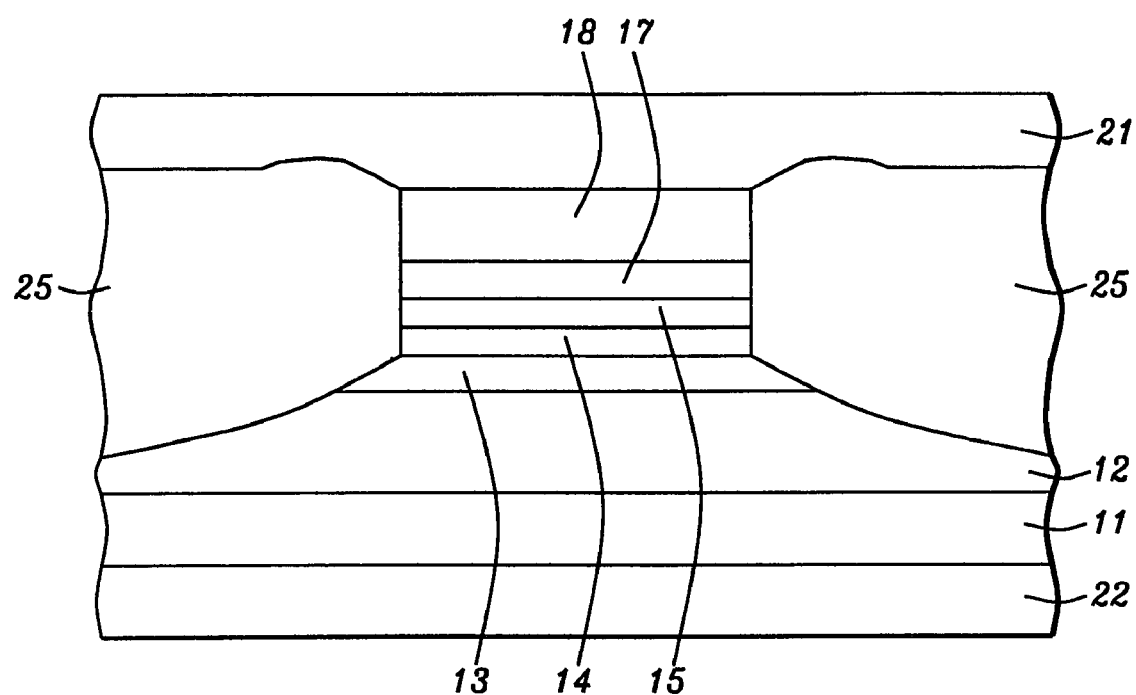
FIG. 5 shows a CPP read head formed according to the teachings of the present invention.

Referring now to FIGS. 4 and 5, the process begins with the provision of a substrate (not shown) onto which is deposited lower conductive lead 22. Then, the following layers are deposited, in sequence, onto one another, as shown:

pinning layer 11, pinned layer 12, non-magnetic spacer layer 13, free layer 14, decoupling layer 15, second pinned layer 17, and second pinning layer 18. This results in the formation of the GMR stack.

Then, IBE is used as described above to form the CIP or CPP pedestal, as shown in FIGS. 4 and 5 respectively. A key feature of the invention is that the beam that is used for the ion milling consists of xenon ions. Etching proceeds until no more than about 0.1 microns have been removed. The pedestal that is thus formed can be seen to include a vertical section that contains all of free layer 14. The thickness of this vertical section is about 0.8 times the thickness of the total amount removed from the stack.

The CIP device is completed as shown in FIG. 4 through the deposition of the opposing longitudinal bias layers 19, followed by the conductive leads 16. The CPP (and TMJ) device is completed with the deposition of dielectric layer 25 on whose top surface together with that of the pedestal, is deposited upper conductive lead 21.

Additional Process Details Are:

The xenon ions have an energy that is less than about 1,200 volts while the xenon ion beam has a current density of between about 20 and 200 $mA/cm^2$. The free layer has a thickness between about 10 and 60 Angstroms and is made of materials such as NIFe or CoFe, while the dielectric insulating layer has a thickness between about 100 and 500 Angstroms.

What is claimed is:

1. A method to form a multilayer pedestal, having an improved vertical profile, comprising:
 - depositing, in succession, two or more layers to form a stack having an area;
 - on said stack, forming a mask having an area that is less than the stack area;
 - then, using a beam that consists of xenon ions, removing material from said stack that is unprotected from said mask, until a surface of a particular layer of said stack is detected through use of secondary ion mass spectroscopy to reach an end point, thereby forming a pedestal whose sidewalls have a more vertical profile than could have been achieved if either argon ions or krypton ions had been used instead of the xenon ions; and
 - then removing said mask.

2. The method described in claim 1 wherein said vertical section has a thickness that is about 0.8 times the thickness removed from the stack.

3. The method described in claim 1 further comprising deposition of a pair of opposing conductive leads onto said sidewalls.

4. The method described in claim 1 wherein said xenon ions have an energy that is less than about 1,200 volts.

5. The method described in claim 1 wherein said xenon ion beam has a current density of between about 20 and 200 mA/cm$^2$.

* * * * *